(12) United States Patent
Wang et al.

(10) Patent No.: US 12,389,542 B2
(45) Date of Patent: Aug. 12, 2025

(54) SEMICONDUCTOR DEVICE AND STORAGE SYSTEM

(71) Applicant: CHANGXIN MEMORY TECHNOLOGIES, INC., Hefei (CN)

(72) Inventors: Yanwu Wang, Hefei (CN); Huifang Dai, Hefei (CN); Yade Fang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 480 days.

(21) Appl. No.: 17/952,324

(22) Filed: Sep. 26, 2022

(65) Prior Publication Data

US 2023/0007849 A1    Jan. 12, 2023

(30) Foreign Application Priority Data

Aug. 4, 2022    (CN) .......................... 202210933315.6

(51) Int. Cl.
*G11C 16/04*    (2006.01)
*H05K 1/18*    (2006.01)

(52) U.S. Cl.
CPC ... *H05K 1/181* (2013.01); *H05K 2201/10015* (2013.01); *H05K 2201/10159* (2013.01)

(58) Field of Classification Search
CPC ......... H05K 1/181; H05K 2201/10015; H05K 2201/10159
See application file for complete search history.

(56) References Cited

U.S. PATENT DOCUMENTS

| | | |
|---|---|---|
| 4,754,366 A | 6/1988 | Hernandez |
| 5,513,135 A | 4/1996 | Dell et al. |
| 9,754,658 B2 * | 9/2017 | Kim .................... G11C 5/063 |
| 9,820,405 B1 * | 11/2017 | Palis .................... H05K 7/1487 |
| 10,236,032 B2 * | 3/2019 | Oh .......................... G11C 5/04 |
| 12,219,691 B2 * | 2/2025 | Haley .................... H05K 1/181 |

FOREIGN PATENT DOCUMENTS

| | | |
|---|---|---|
| CN | 101359653 A | 2/2009 |
| CN | 109478173 A | 3/2019 |
| CN | 111696948 A | 9/2020 |
| CN | 114550761 A | 5/2022 |

OTHER PUBLICATIONS

The first office action and search report received in the counterpart CN Application 202210933315.6, mailed on Dec. 17, 2024.

* cited by examiner

*Primary Examiner* — Pho M Luu

(74) *Attorney, Agent, or Firm* — Kilpatrick Townsend & Stockton LLP

(57) ABSTRACT

A semiconductor device and a storage system are provided. The semiconductor device includes a first printed circuit board and a capacitor structure positioned on the first printed circuit board. The first printed circuit board includes a plurality of memories arranged in sequence along a first direction, and each of the memories has a first power terminal and a first ground terminal. The capacitor structure includes a plurality of capacitors, and each of the capacitors has a second power terminal corresponding to the first power terminal and a second ground terminal corresponding to the first ground terminal, wherein the first power terminal is electrically connected to the second power terminal, and the first ground terminal is electrically connected to the second ground terminal.

20 Claims, 4 Drawing Sheets

SEMICONDUCTOR DEVICE AND STORAGE SYSTEM

CROSS-REFERENCE TO RELATED APPLICATION

This application claims priority to Chinese Patent Application No. 202210933315.6, titled "SEMICONDUCTOR DEVICE AND STORAGE SYSTEM" and filed to the State Patent Intellectual Property Office on Aug. 4, 2022, the entire contents of which are incorporated herein by reference.

TECHNICAL FIELD

Embodiments of the present disclosure relate to the field of semiconductors, and more particularly, to a semiconductor device and a storage system.

BACKGROUND

In a computing system, a processor, one or more memory modules, and other circuits may be coupled to a printed circuit board (PCB), that is, "mainboard" of a host system. The memory modules may be dual-inline-memory-modules (DIMMs). Each dual-inline-memory-module (DIMM) includes a DIMM PCB and a plurality of random access memory (RAM) chips arranged on the DIMM PCB. The DIMMs are connected to the mainboard via memory pins.

With rapid development of storage technologies and faster dynamic random access memories (DRAMs), the DIMM PCB is also constantly developing, and a rate of a double data rate 5 (DDR5) computer memory has reached 8,800 Mbps. Meanwhile, demands for high bandwidth also bring requirements for systems need to quickly respond to load changes, followed by impacts on power quality and signal quality. Limited by space of the PCB, the existing DIMM PCB cannot be provided with additional capacitors, and routing of signal lines may be adversely affected even though the additional capacitors can be provided, thereby adversely affecting the power quality and the signal quality.

SUMMARY

Embodiments of the present disclosure provide a semiconductor device and a storage system.

According to some embodiments of the present disclosure, one aspect of the embodiments of the present disclosure provides a semiconductor device, which includes a first printed circuit board and a capacitor structure positioned on the first printed circuit board. The first printed circuit board includes a plurality of memories arranged in sequence along a first direction, and each of the memories has a first power terminal and a first ground terminal. The capacitor structure includes a plurality of capacitors, and each of the capacitors has a second power terminal corresponding to the first power terminal and a second ground terminal corresponding to the first ground terminal, where the first power terminal is electrically connected to the second power terminal, and the first ground terminal is electrically connected to the second ground terminal.

In one aspect, the embodiments of the present disclosure provides a storage system, including a processor and the semiconductor device, where the processor is electrically connected to the semiconductor device via the memory interface.

BRIEF DESCRIPTION OF THE DRAWINGS

Exemplary descriptions of one or more embodiments are made by means of pictures in corresponding drawings, and these exemplary descriptions do not constitute a limitation on the embodiments. Unless otherwise stated, the pictures in the drawings do not constitute a scale limitation. Exemplary descriptions are made to one or more embodiments with reference to pictures in the corresponding drawings, and these exemplary descriptions do not constitute limitations on the embodiments. Unless otherwise stated, the figures in the accompanying drawings do not constitute a scale limitation. To describe the technical solutions of the embodiments of the present disclosure or those of the prior art more clearly, the accompanying drawings required for describing the embodiments will be briefly introduced below. Apparently, the accompanying drawings in the following description are merely some embodiments of the present disclosure. To those of ordinary skills in the art, other accompanying drawings may also be derived from these accompanying drawings without creative efforts.

DETAILED DESCRIPTION

Figure 1:
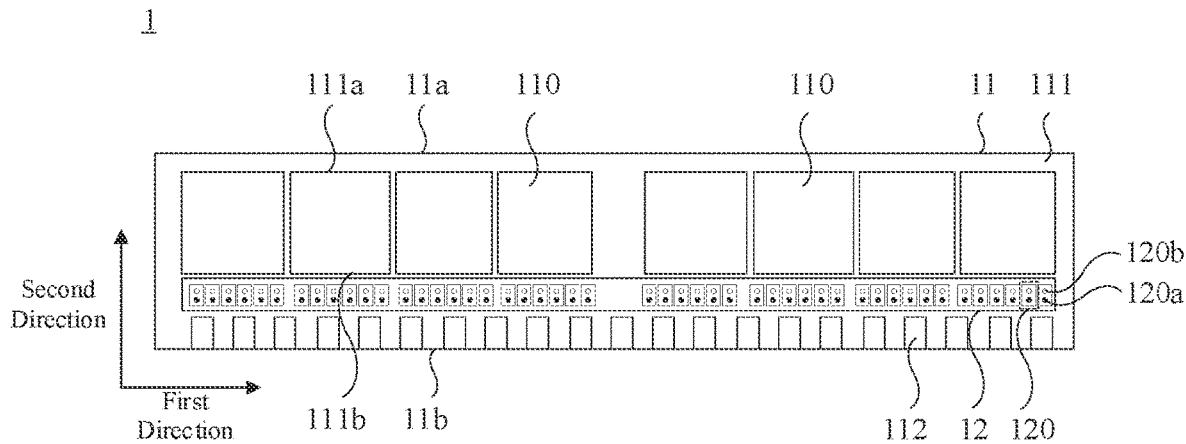
FIG. 1 is a schematic structural diagram of a semiconductor device provided by an embodiment of the present disclosure.

As can be known from the background art, limited by the space of a printed circuit board (PCB), generally required number of capacitors cannot be arranged on dual-inline-memory-module (DIMM) and a large number of capacitors may adversely affect routing of signal lines on the PCB, thereby adversely affecting power quality and signal quality.

To solve impacts of the power quality of the DIMM on a system, the power quality is optimized generally by additionally providing the capacitors on a mainboard or the DIMM or by optimizing a power supply mode on the mainboard. However, limited by the space of the PCB, generally the required number of capacitors cannot be arranged on the DIMM. Therefore, how to optimize the power quality and the signal quality without increasing occupied area of the DIMM is a problem to be solved urgently at present.

To solve the problem of capacitor arrangement space and the problem of the number of capacitors, an embodiment of the present disclosure provides a semiconductor device. By arranging a capacitor structure on a DIMM PCB, a first printed circuit board includes a plurality of memories arranged in sequence along a first direction, and each of the memories has a first power terminal and a first ground terminal. The capacitor structure includes a plurality of capacitors, and each of the capacitors has a second power terminal corresponding to the first power terminal and a second ground terminal corresponding to the first ground terminal. The first power terminal is electrically connected to the second power terminal, and the first ground terminal is electrically connected to the second ground terminal. According to the embodiments of the present disclosure, by properly utilizing limited space of the first printed circuit board, the capacitor structure is additionally provided on the first printed circuit board, which not only can save routing space for the first printed circuit board, but also can effectively reduce impedance, thereby enhancing stability of power voltage, such that a problem of number of capacitors is solved while a problem of capacitor arrangement space is solved.

The embodiments of the present disclosure will be described in detail below in conjunction with the accompanying drawings. However, a person of ordinary skill in the art may understand that in the embodiments of the present disclosure, many technical details are put forward such that a reader may better understand the embodiments of the present disclosure. However, the technical solutions requested to be protected by the embodiments of the present disclosure may also be implemented even without these technical details or various variations and modifications based on the following embodiments.

An embodiment of the present disclosure provides a semiconductor device, which will be described in detail below with reference to the accompanying drawings. FIGS. 1 to 6 are schematic structural diagrams of the semiconductor device provided by the embodiment of the present disclosure; and FIG. 7 is a schematic cross-sectional view showing package of the semiconductor device provided by the embodiment of the present disclosure. It should be noted that, for convenience of description and a clear illustration of a package structure of the semiconductor device, FIGS. 8 to 10 in this embodiment are schematic cross-sectional views of a partial package structure of the semiconductor device; and FIG. 11 is a schematic structural diagram of a storage system provided by the embodiment of the present disclosure.

The semiconductor device provided by the embodiment of the present disclosure will be described in more detail below with reference to the accompanying drawings.

Referring to FIG. 1, one aspect of the embodiment of the present disclosure provides a semiconductor device 1, which includes a first printed circuit board 11 and a capacitor structure 12 positioned on the first printed circuit board 11. The first printed circuit board 11 includes a plurality of memories 110 arranged in sequence along a first direction, and each of the memories 110 has a first power terminal 110*a* (not shown in FIG. 1) and a first ground terminal 110*b* (not shown in FIG. 1). The capacitor structure 12 includes a plurality of capacitors 120, and each of the capacitors 120 has a second power terminal 120*a* corresponding to the first power terminal 110*a* and a second ground terminal 120*b* corresponding to the first ground terminal 110*b*, where the first power terminal 110*a* is electrically connected to the second power terminal 120*a*, and the first ground terminal 110*b* is electrically connected to the second ground terminal 120*b*.

In some embodiments, the first printed circuit board 11 may be a DIMM PCB, or may be a RDIMM PCB, short for a PCB of a registered dual in-line memory module (RDIMM), or may also be a UDIMM PCB, short for a PCB of unbuffered dual in-line memory modules (UDIMM).

In some embodiments, the memory 110 may be a dynamic random access memory (DRAM), or may be a synchronous dynamic random access memory (SDRAM). Each memory 110 is connected to a memory bus through signal transmission lines. According to the embodiment of the present disclosure, to optimize the power quality, the capacitor structure 12 is additionally provided on the first printed circuit board 11. The capacitor structure 12 may be arranged on a front surface of the first printed circuit board 11, or may be arranged on a back surface of the first printed circuit board 11. According to the embodiment of the present disclosure, the capacitor structure 12 is properly arranged on the first printed circuit board 11, such that the capacitor structure 12 may be additionally provided in the limited space of the first printed circuit board 11, which can save routing space for the first printed circuit board, and thus an integration level of the semiconductor device is improved.

In addition, a power impedance formula is as shown in the following formula (1):

$$Z = \sqrt{\frac{L}{C}} Z = \sqrt{\frac{L}{C}} \quad (1)$$

According to the power impedance formula (1), it may be known that increase of capacitance may effectively reduce the impedance. According to dv/dt=Z*di/dt, it may be known that the smaller the impedance is, the smaller the voltage change is, and the more stable the voltage is.

According to the embodiment of the present disclosure, a power impedance test is performed on the semiconductor device 1 additionally provided in the capacitor structure 12. It may be seen that after the capacitor structure 12 is additionally provided on the DIMM PCB, the power impedance of the DIMM is increased by at least 30%. From an actual measurement result, a board-level voltage of the DIMM PCB is increased from 1.143 V to 1.173 V. Therefore, in the embodiment of the present disclosure, the capacitor structure 12 is additionally provided on the first printed circuit board 11, which can also effectively reduce the impedance, enhance the stability of the power voltage, thereby solving the problem of number of capacitors while solving the problem of capacitor arrangement space. The capacitor structure 12 is connected to the memory bus via the signal transmission lines. The second power terminal 120*a* of each capacitor 120 is connected to the first power terminal 110*a* of the memory 110, and the second ground terminal 120*b* of each capacitor 120 is connected to the first ground terminal 110*b* of the memory 110, to implement the connection between the capacitor structure 12 and the memory 110.

In the embodiment of the present disclosure, the number of the capacitors 120 in the capacitor structure 12 is set according to actual needs, and the number of the capacitors 120 in the capacitor structure 12 is not limited in the embodiment of the present disclosure.

It should be noted that the first printed circuit board 11 may be a single-sided DIMM structure or a double-sided DIMM structure. In the embodiment of the present disclosure, the conventional single-sided DIMM structure and the conventional double-sided DIMM structure are improved on the basis of their original structures. The capacitor structure 12 is additionally provided on the first printed circuit board 11 to optimize the power quality of the semiconductor device.

A detailed description is made below by taking an example where the first printed circuit board 11 is the single-sided DIMM structure.

With continued reference to FIG. 1, in some embodiments, the first printed circuit board 11 includes a first surface 111 and a memory interface 112 arranged on the first surface 111; and the memory 110 and the capacitor structure 12 are positioned on the first surface 111, and the capacitor structure 12 is positioned between the memory 110 and the memory interface 112.

It should be noted that the first surface 111 of the first printed circuit board 11 may be understood as the front surface of the first printed circuit board 11, the memory 110 and the memory interface 112 (gold finger) are positioned on the front surface of the first printed circuit board 11. There are a plurality of memories 110 and a plurality of memory interfaces 112, and the plurality of memories 110 are sequentially arranged on the front surface of the first printed circuit board 11 along the first direction, where the first direction is a length direction of the first printed circuit board 11, and the second direction is a width direction of the first printed circuit board 11. In the second direction, bottom ends of the plurality of memories 110 arranged sequentially are substantially flush with each other.

As shown in FIG. 1, in the second direction, the first printed circuit board 11 has the first terminal 11a and the second terminal 11b opposite to the first terminal 11a, the memory 110 has a first terminal portion 111a and a second terminal portion 111b opposite to the first terminal portion 111a, the first terminal portion 111a is close to the first terminal 11a with respect to the second terminal portion 111b, and the second terminal portion 111b is close to the second terminal 11b with respect to the first terminal portion 111a. An area between the second terminal portion 111b of the memory 110 and the second terminal 11b of the first printed circuit board 11 is provided with the plurality of memory interfaces 112 arranged in sequence along the first direction, open terminals of the memory interfaces 112 are arranged close to the second terminal 11b of the first printed circuit board 11, and generally the open terminals of the memory interfaces 112 are flush with the second terminal 11b of the first printed circuit board 11.

In the embodiment of the present disclosure, the capacitor structure 12 is arranged on the same surface as the memory 110 and the memory interface 112. That is, the capacitor structure 12 is arranged on the front surface of the first printed circuit board 11, and the capacitor structure 12 is properly arranged in the area between the memory 110 and the memory interface 112. Because this area is close to the gold finger and this area needs to be subjected to routing and to guarantee power performance, the capacitor structure 12 may be arranged in this area to properly utilize the first printed circuit board 11. Furthermore, the capacitors 120 may be combined and arranged on one circuit board, and some capacitors are shared, which not only can reduce the number of capacitors/via holes, but also can optimize signal routing.

It should be noted that the structure design where the capacitor structure 12 is arranged on the first surface 111 and positioned between the memory 110 and the memory interface 112 is mainly applicable to cases where more devices are provided on the first printed circuit board 11 (PCB) and space resources are in shortage. Based on such arrangement, soldering points and the via holes may be shared to save the routing space for the PCB. In addition, the structure design is more flexible, such that the capacitor structure may be properly distributed according to the space of the PCB.

Figure 2:
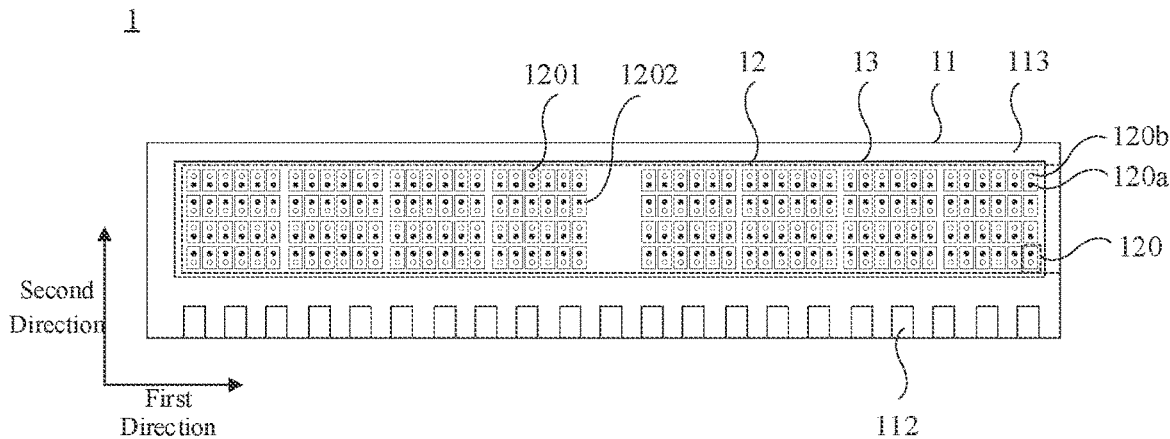
FIGS. 2 to 6 are schematic structural diagrams of a semiconductor device provided by another embodiment of the present disclosure.

Referring to FIG. 2, in some embodiments, the first printed circuit board 11 includes a first surface 111 and a second surface 113 opposite to the first surface 111; and the plurality of memories 110 are positioned on the first surface 111, and the capacitor structure 12 is positioned on the second surface 113. Orthographic projections of the plurality of memories 110 on the first surface 111 are positioned inside an orthographic projection of the capacitor structure 12 on the first surface 111.

As shown in FIG. 2, the capacitor structure 12 and the memory 110 are not positioned on the same surface. The capacitor structure 12 is positioned on the second surface 113 of the first printed circuit board 11. That is, the capacitor structure 12 is positioned on the back surface of the first printed circuit board 11, and the capacitor structure 12 is positioned on the back surface of the memory 110. To facilitate the connection between the capacitor structure 12 and the memory 110, the capacitor structure 12 is arranged on the back surface of the area where the memory 10 is positioned. In some embodiments, the capacitor structure 12 and the memory 110 may be arranged back to back. All the memories 110 positioned on the front surface of the first printed circuit board 11 share one capacitor structure 12. Based on such arrangement, a high integration level is implemented, and only one capacitor structure 12 is needed, such that the routing space of the first printed circuit board 11 can be saved.

Figure 3:
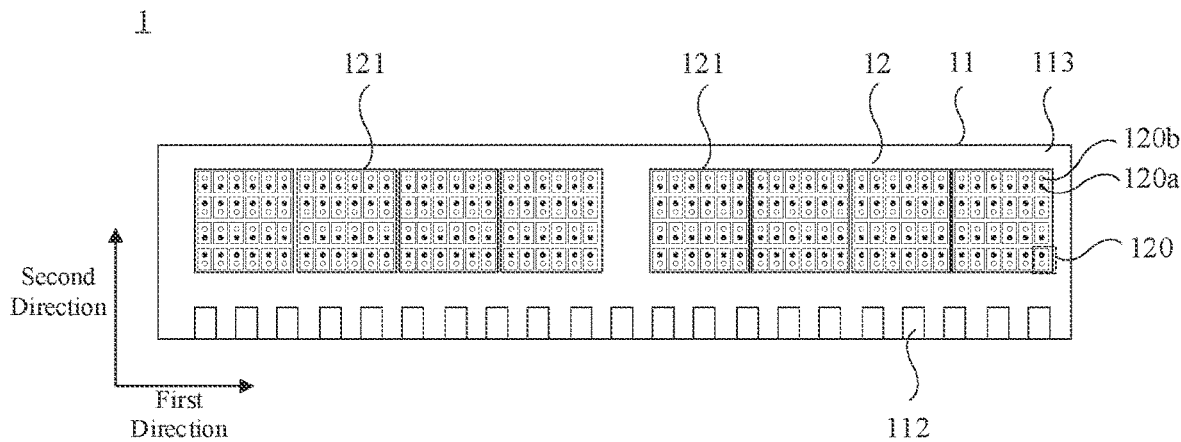

Referring to FIG. 3, in some embodiments, the capacitor structure 12 includes a plurality of sub capacitor structures 121 in one-to-one correspondence with the memories 110, and orthographic projections of the sub capacitor structures 121 on the first surface 111 are overlapped with the orthographic projections of the memories 110 on the first surface 111.

As shown in FIG. 3, the capacitor structure 12 is not positioned on the same surface as the memory 110, and the capacitor structure 12 is positioned on the back surface of the first printed circuit board 11. The sub capacitor structures 121 are in one-to-one correspondence with the memories 110; and the capacitors 120 of the capacitor structure 12 may be positioned on one printed circuit board, or certain number of capacitors may be combined to form the sub capacitor structures 121. Next, each sub capacitor structure 121 is arranged on a corresponding sub printed circuit board, and then the sub printed circuit board and the first printed circuit board 11 are packaged. Positions of the sub printed circuit boards are in one-to-one correspondence with positions of the memories 110, and the sub printed circuit boards where the sub capacitor structures 121 are positioned have approximately same size as the memories 110. The sub capacitor structures 121 are arranged on the back surface of the corresponding memories 110, and the capacitance of each memory 110 is relatively uniform. The number of memories 110 is consistent with the number of sub capacitor structures 121. FIG. 3 shows a schematic structural diagram of the semiconductor device having the first printed circuit board 11 provided with eight memories 110 and eight sub capacitor structures 121. It should be noted that the number of sub capacitor structures 121 and the number of capacitors 120 in the sub capacitor structures 121 are not limited in the embodiments of the present disclosure.

The above embodiments of the present disclosure illustrate the structure of the semiconductor device of the single-sided DIMM. As mentioned above, the DIMM may also be the double-sided DIMM. That is, the memory 110, the memory interface 112, and the capacitor structure 12 are respectively arranged on the first surface 111 and the second surface 113 of the first printed circuit board 11. The structure of the semiconductor device of the double-sided DIMM will be described in detail below.

Figure 4:
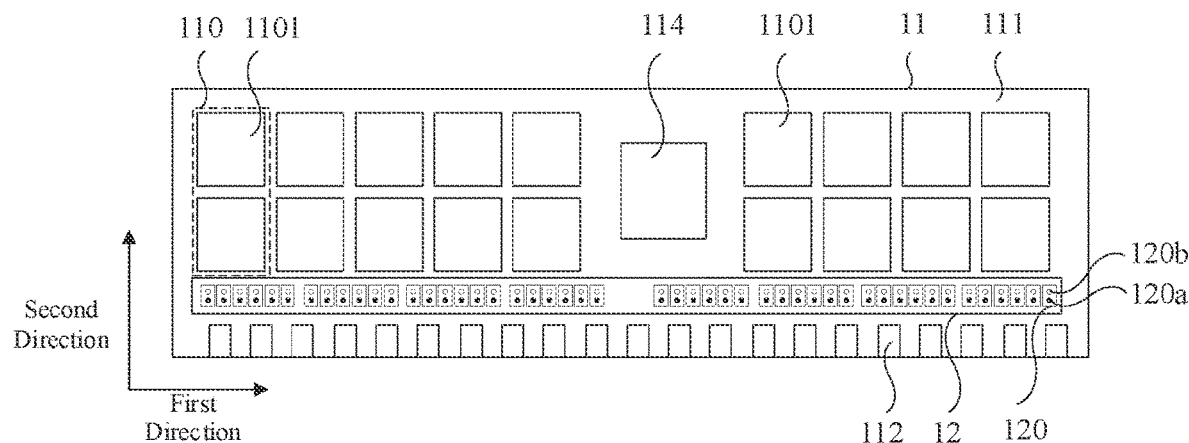

Referring to FIG. 4, in some embodiments, the first printed circuit board 11 includes a first surface 111 and a second surface 113 opposite to the first surface 111, the first surface 111 and the second surface 113 are respectively provided with the plurality of memories 110 arranged in sequence along the first direction, and each of the plurality of memories 110 includes at least two sub memories 1101 arranged in sequence along the second direction. The first printed circuit board 11 further includes a plurality of memory interfaces 112 arranged in sequence along the first direction, the capacitor structure 12 is positioned between a side of one of the sub memories 1101 close to one of the plurality of memory interfaces 112 and a side of the memory interface 112 away from an edge of the first printed circuit board 11.

FIG. 4 shows a schematic diagram of the first surface 111 of the first printed circuit board 11. The layout design of the second surface 113 of the first printed circuit board 11 is the same as the layout design of the first surface 111 of the first printed circuit board 11, as shown in FIG. 5.

Figure 5:
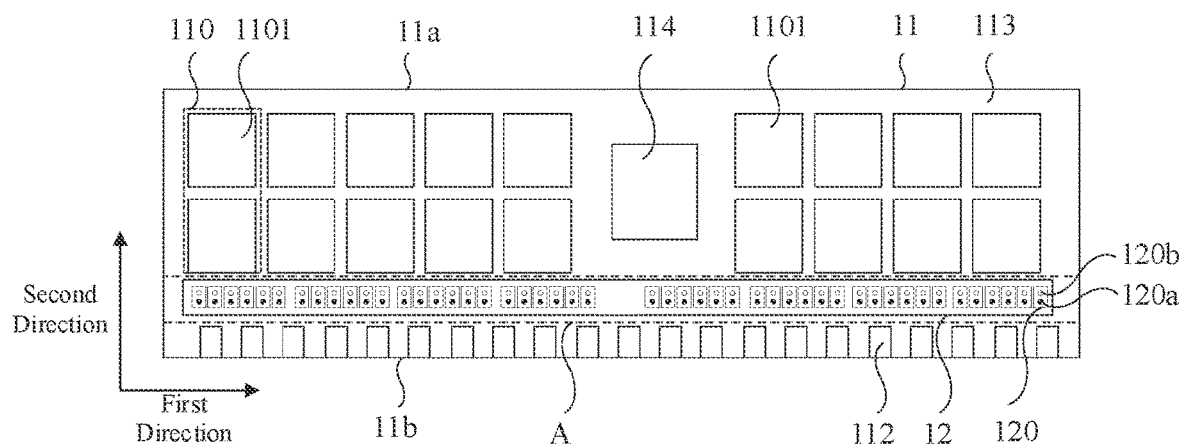

With continued reference to FIG. 4 and FIG. 5, in some embodiments, the first surface 111 and the second surface 113 are respectively provided with nine memories 110 arranged in sequence along the first direction, where each of the nine memories 110 includes two sub memories 1101 arranged in sequence along the second direction.

As shown in FIG. 4 and FIG. 5, the sub memories 1101 are arranged in a matrix with two rows and nine columns. Because the sub memories 1101 occupy more space on the first printed circuit board 11, the capacitor structure 12 may be arranged in a narrow strip area A. Here, the narrow strip area A is an area between a side of the sub memory 1101 close to the memory interface 112 and a side of the memory interface 112 away from the second terminal 11b of the first printed circuit board 11. That is, the narrow strip area A is an area between lower edges of the sub memories 1101 in the second row and upper edges of the memory interfaces 12. The capacitor structure 12 is arranged in the narrow strip area A to properly utilize the limited space of the first printed circuit board 11. In some embodiments, the capacitors 120 may be combined and arranged on one circuit board, and some capacitors are shared, such that the soldering points and the via holes may be shared, the routing space of the PCB may be saved, and the signal routing of the PCB may be optimized. In addition, the structure design is more flexible, such that the capacitors may be properly distributed according to the space of the PCB.

Figure 6:
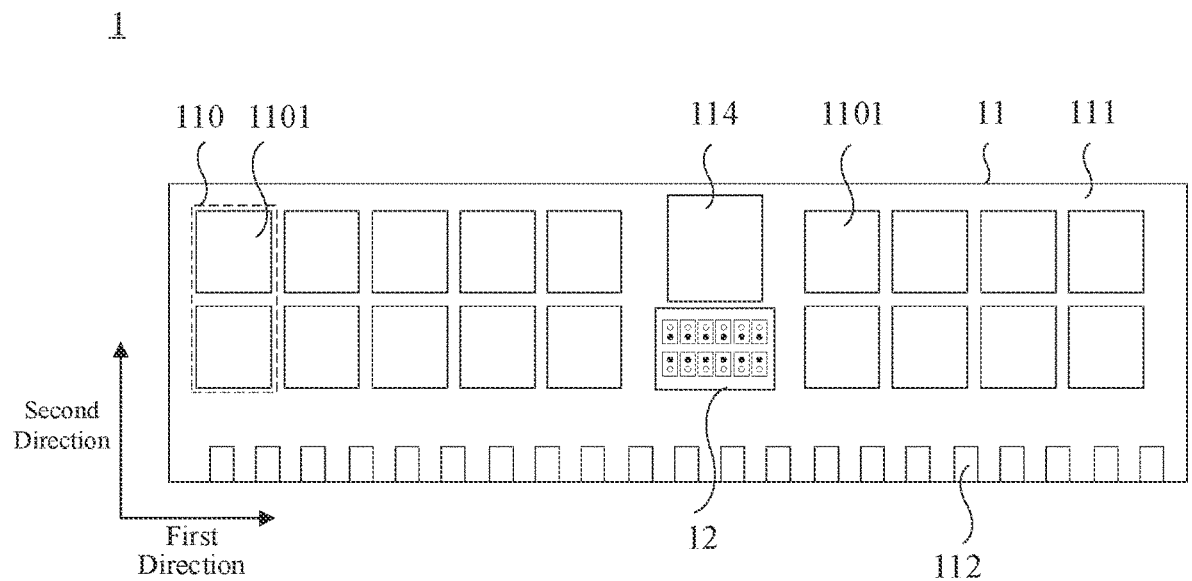
Figure 7:
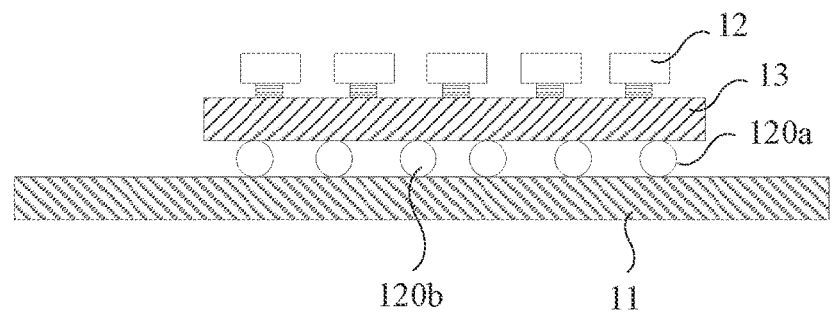
FIG. 7 is a schematic cross-sectional view showing package of a semiconductor device provided by an embodiment of the present disclosure.

Referring to FIG. 6, in some embodiments, the first printed circuit board 11 further includes a register 114 respectively arranged on the first surface 111 and the second surface 113; and the capacitor structure 12 is positioned between a side of the register 114 close to the memory interface 112 and the side of the memory interface 112 away from the edge of the first printed circuit board 11.

The register 114 is arranged on the first printed circuit board 11 and is mainly configured to buffer, between the host controller (processor) and the DRAM, command address (CA) buses, commands, and clock control signals to the DIMM. The register 114 clock driver (RCD) of a conventional DIMM structure is positioned between two memories 110 in the center of the first printed circuit board 11. In the embodiment of the present disclosure, to arrange the capacitor structure 12 between the two memories 110 in the center of the first printed circuit board 11, the register 114 is moved up to leave more space for the capacitor structure 12. As shown in FIG. 6, the register 114 is moved up, the capacitor structure 12 is positioned between the register 114 and the memory interface 112, the upper edge of the register 114 is close to the first terminal 11a of the first printed circuit board 11, the lower edge of the capacitor structure 12 may be substantially flush with the lower edge of a row of memories 110 close to the memory interface 112, and the lower edge of the capacitor structure 12 may also protrudes from the lower edge of the row of memories 110 close to the memory interface 112. When the capacitor structure 12 is arranged between the lower edge of the register 114 and the memory interface 112, the routing of the first printed circuit board 11 is not adversely affected, and the integration level of the first printed circuit board 11 is also improved.

It should be noted that the RDIMM may include the register clock driver (RCD), and for the load-reduced dual-inline-memory-module (LRDIMM), a data buffer chip (DB chip) may also be arranged on the first printed circuit board 11, where the DB chip is configured to buffer data signals from the memory controller or the dynamic random access memory (DRAM). Two register RCDs and the DB chip are required on the LRDIMM to jointly implement the buffer function, so the register RCDs and the DB chip may be integrated together on the LRDIMM to save the space of the first printed circuit board 11 and improve the integration level of the semiconductor device.

Referring to FIG. 2, in some embodiments, the above-mentioned semiconductor device 1 further includes a second printed circuit board 13, and the capacitor structure 12 is positioned on the second printed circuit board 13. The capacitor structure 12 includes a plurality of first capacitors 1201 arranged in sequence along the first direction and a plurality of second capacitors 1202 arranged in sequence along a second direction. By arranging the capacitor structure 12 on the second printed circuit board 13, structural stability of the capacitor structure 12 is increased; and by packaging the second printed circuit board 13 and the first printed circuit board 11, structural stability of the semiconductor device is also increased.

In some embodiments, the second printed circuit board 13 is electrically connected to the first power terminal 110a of the memory 110 via the second power terminal 120a, and the second printed circuit board 13 is electrically connected to the first ground terminal 110b of the memory 110 via the second ground terminal 120b.

FIG. 7 is a schematic cross-sectional view showing package of the semiconductor device provided by an embodiment of the present disclosure. As can be seen from FIG. 7, the capacitor structure 12 is arranged on the second printed circuit board 13 by means of surface mounted technology, and there are ball grid array (BGA) solder balls on the capacitor structure 12, which are respectively the second power terminal 120a and the second ground terminal 120b. The soldering points corresponding to the BGA solder balls are reserved on the first printed circuit board 11 (DIMM PCB), the capacitors 120 are soldered to the capacitor structure 12 by the corresponding power terminal and ground terminal through the surface mounted technology (SMT), and then the capacitor structure 12 is soldered to the DIMM PCB through SMT. When the capacitor structure 12 is arranged on the second printed circuit board 13, the capacitors 120 are soldered on the second printed circuit board 13 through SMT, and then the second printed circuit board 13 is soldered onto the first printed circuit board 11 through SMT.

It should be noted that the number of first capacitors 1201 and the number of second capacitors 1202 in the embodiment of the present disclosure may be set according to actual needs. The number of first capacitors 1201 and the number of second capacitors 1202 are not limited in the embodiment of the present disclosure.

Figure 8:
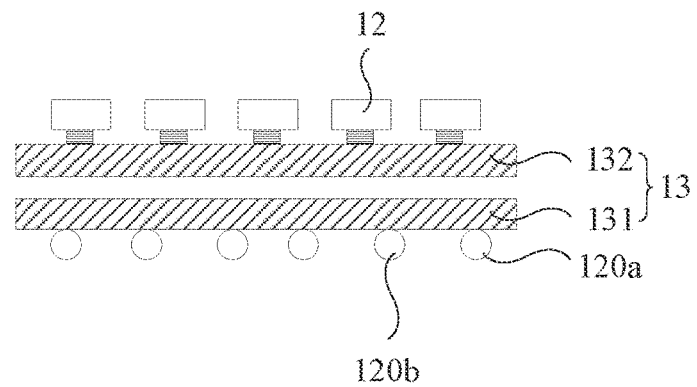
FIGS. 8 to 10 are schematic cross-sectional views of a partial package structure of a semiconductor device provided by an embodiment of the present disclosure.

Referring to FIG. 8, in some embodiments, the capacitors 120 are fixed to a surface of the second printed circuit board 13 by means of SMT.

In some embodiments, the capacitor 120 may be soldered onto the second printed circuit board 13 by means of SMT. The second printed circuit board 13 may be a single-layer board or double-layer board structure. As shown in FIG. 8, the second printed circuit board 13 may include a first board 131 and a second board 132, where the second board 132 is positioned above the first board 131. Pins of the capacitor 120 are fixed to a surface of the second board 132 away from the first board 131 by solders, such that the capacitor 120 is fixed to the second board 132 to implement the reliable soldering between the capacitor 120 and the second printed circuit board 13, and also it is advantageous to ensuring compactness of the structure.

Figure 9:
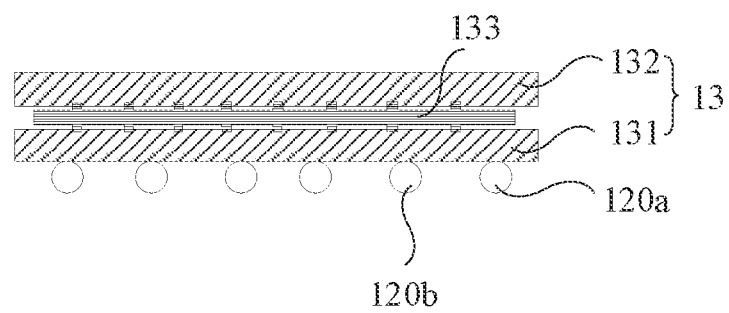

Referring to FIG. 9, in some embodiments, the second printed circuit board 13 includes the first board 131, the second board 132, and a capacitor material layer 133 arranged between the first board 131 and the second board 132; and the capacitors 120 are formed by pressing the capacitor material layer 133.

As shown in FIG. 9, the capacitor material layer 133 is arranged between the first board 131 and the second board 132. The capacitor material layer 133 may include one or more layers of tiled chip capacitors. By pressing the capacitor material layer 133, the formed capacitors 120 are embedded between the first board 131 and the second board 132 to improve the integration level of the capacitors 120 on the second printed circuit board 13.

Figure 10:
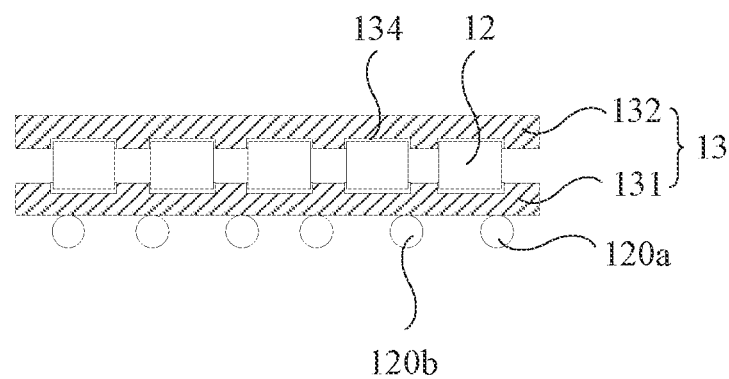
Figure 11:
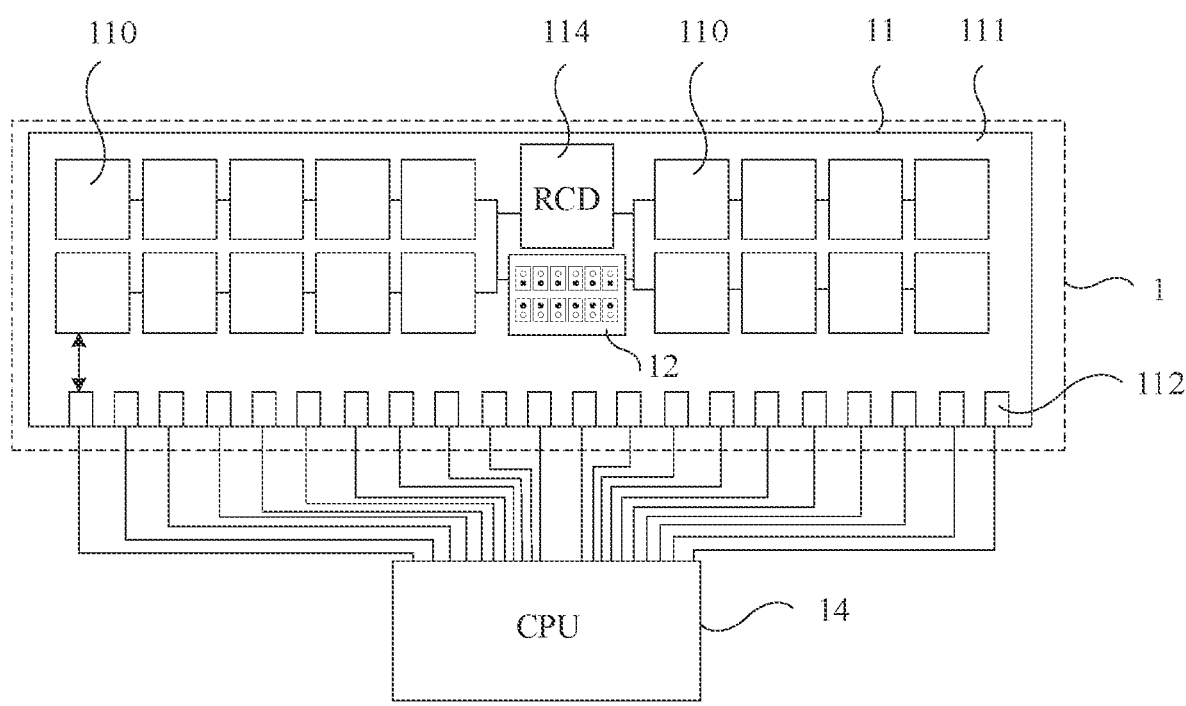
FIG. 11 is a schematic structural diagram of a storage system provided by an embodiment of the present disclosure.

Referring to FIG. 10, in some embodiments, the second printed circuit board 13 includes the first board 131 and the second board 132, the capacitor container slot 134 is respectively provided on the opposite surface between the first board 131 and the second board 132, and the capacitor 120 is positioned in the capacitor container slot 134. The capacitor 120 is arranged in the capacitor container slot 134 to form the embedded capacitor structure 12, thereby minimizing the capacitor structure 12 and making the structure of the semiconductor device 1 more compact. According to the embodiment of the present disclosure, the capacitor container slot 134 is respectively provided on the first board 131 and the second board 132, such that the capacitor 120 is positioned in the capacitor container slot 134 to form the embedded capacitor structure 12. Based on such arrangement, capacitance distribution is formed inside the second printed circuit board 13, such that the capacitance requirement of a bearer circuit of the second printed circuit board 13 is met, and anti-electromagnetic interference capability of the second printed circuit board 13 is improved.

In some embodiments, the height of the capacitor structure 12 is less than or equal to that of the memory 110.

It should be noted that limited by space and size, there are no sufficient capacitors arranged on the conventional DIMM PCB. Therefore, in the embodiment of the present disclosure, it is defined that the height of the capacitor structure 12 is less than or equal to that of the memory 110, such that after the capacitor structure 12 is additionally provided on the DIMM PCB, the height of the DIMM PCB of the semiconductor device is equal to that of the original DIMM PCB, such that packaging of the capacitor structure 12 and the first printed circuit board 11 is facilitated. In addition, the height of the capacitor structure is smaller, which does not additionally increase the overall height of the semiconductor device. In addition, in the embodiment of the present disclosure, some capacitors 120 are integrated on the DIMM PCB, which can effectively overcome the defect of insufficient number of the capacitors 120.

Referring to FIG. 11, one aspect of the embodiments of the present disclosure provides a storage system, which includes: a processor 14 and the above-mentioned semiconductor device 1, where the processor 14 is electrically connected to the semiconductor device 1 through the memory interface 112. The processor 14 (CPU) is connected to the memory 110 and the capacitor structure 12 via the memory interface 112 of the semiconductor device 1 through the signal transmission lines.

In the semiconductor device and the storage system provided by the embodiments of the present disclosure, the capacitor structure 12 is properly arranged on the first printed circuit board 11 to optimize the power quality. The capacitor structure 12 of the embodiments of the present disclosure includes a plurality of capacitors 120, each of the capacitors 120 has a second power terminal 120a corresponding to the first power terminal 110a of the memory 110 and a second ground terminal 120b corresponding to the first ground terminal 110b of the memory 110. The first power terminal 110a is electrically connected to the second power terminal 120a, and the first ground terminal 110b is electrically connected to the second ground terminal 110b. In this way, the connection between the memory 110 and the capacitor 120 is implemented. According to the embodiments of the present disclosure, by properly utilizing limited space of the first printed circuit board 11, the capacitor structure 12 is additionally provided on the first printed circuit board 11, which not only can save routing space for the first printed circuit board 11, but also can effectively reduce impedance, thereby enhancing stability of power voltage, such that a problem of number of the capacitors 120 is solved while the problem of arrangement space of the capacitors 120 is solved.

Those of ordinary skill in the art can understand that the above-mentioned embodiments are some embodiments for realizing the present disclosure, but in practical applications, various changes may be made to them in form and details without departing from the spirit and scope of the present disclosure. Any person skilled in the art can make their own changes and modifications without departing from the spirit and scope of the present disclosure. Therefore, the protection scope of the present disclosure shall be subject to the scope defined by the claims.

What is claimed is:

1. A semiconductor device, comprising:
   a first printed circuit board comprising a plurality of memories arranged in sequence along a first direction, each of the plurality of memories having a first power terminal and a first ground terminal; and
   a capacitor structure positioned on the first printed circuit board, the capacitor structure comprising a plurality of capacitors, each of the plurality of capacitors having a second power terminal corresponding to the first power terminal and a second ground terminal corresponding to the first ground terminal;
   wherein the first power terminal is electrically connected to the second power terminal, and the first ground terminal being electrically connected to the second ground terminal;
   wherein the first printed circuit board comprises a first surface and a second surface opposite to the first surface;
   the plurality of memories are positioned on the first surface, and the capacitor structure being positioned on the second surface; and orthographic projections of the plurality of memories on the first surface are positioned inside an orthographic projection of the capacitor structure on the first surface.

2. The semiconductor device according to claim 1, wherein the first printed circuit board comprises a first surface and a memory interface arranged on the first surface; and the plurality of memories and the capacitor structure are positioned on the first surface, and the capacitor structure being positioned between the plurality of memories and the memory interface.

3. The semiconductor device according to claim 1, wherein the capacitor structure comprises a plurality of sub capacitor structures in one-to-one correspondence with the plurality of memories, and orthographic projections of the plurality of sub capacitor structures on the first surface being overlapped with the orthographic projections of the plurality of memories on the first surface.

4. The semiconductor device according to claim 1, wherein the first printed circuit board comprises a first surface and a second surface opposite to the first surface, the first surface and the second surface being respectively provided with the plurality of memories arranged in sequence along the first direction, and each of the plurality of memories comprising at least two sub memories arranged in sequence along a second direction; and the first printed circuit board further comprises a plurality of memory interfaces arranged in sequence along the first direction, the capacitor structure being positioned between a side of a given one of the sub memories close to a given one of the plurality of memory interfaces and a side of the given memory interface away from an edge of the first printed circuit board.

5. The semiconductor device according to claim 4, wherein the first surface and the second surface are respectively provided with nine memories arranged in sequence along the first direction, each of the nine memories comprising two sub memories arranged in sequence along the second direction.

6. The semiconductor device according to claim 4, wherein the first printed circuit board further comprises a register respectively arranged on the first surface and the second surface; and the capacitor structure is positioned between a side of the register close to the given memory interface and the side of the given memory interface away from the edge of the first printed circuit board.

7. The semiconductor device according to claim 1, further comprising a second printed circuit board, wherein the capacitor structure is positioned on the second printed circuit board; and the capacitor structure comprises a plurality of first capacitors arranged in sequence along the first direction and a plurality of second capacitors arranged in sequence along a second direction.

8. The semiconductor device according to claim 7, wherein the plurality of capacitors are fixed to a surface of the second printed circuit board by means of surface mounted technology.

9. The semiconductor device according to claim 7, wherein the second printed circuit board comprises a first board, a second board, and a capacitor material layer arranged between the first board and the second board; and the plurality of capacitors are formed by pressing the capacitor material layer.

10. The semiconductor device according to claim 7, wherein the second printed circuit board comprises a first board and a second board, a capacitor container slot being respectively provided on a surface of the first board and a surface of the second board opposite to each other, and the capacitor structure being positioned in the capacitor container slot.

11. The semiconductor device according to claim 7, wherein the second printed circuit board is electrically connected to the first power terminal of a given one of the plurality of memories via the second power terminal, and the second printed circuit board being electrically connected to the first ground terminal of the given memory via the second ground terminal.

12. The semiconductor device according to claim 1, wherein a height of the capacitor structure is less than or equal to a height of each of the plurality of memories.

13. A semiconductor device, comprising:
a first printed circuit board comprising a plurality of memories arranged in sequence along a first direction, each of the plurality of memories having a first power terminal and a first ground terminal; and
a capacitor structure positioned on the first printed circuit board, the capacitor structure comprising a plurality of capacitors, each of the plurality of capacitors having a second power terminal corresponding to the first power terminal and a second ground terminal corresponding to the first ground terminal;
wherein the first power terminal is electrically connected to the second power terminal, and the first ground terminal being electrically connected to the second ground terminal;
wherein the first printed circuit board comprises a first surface and a second surface opposite to the first surface, the first surface and the second surface being respectively provided with the plurality of memories arranged in sequence along the first direction, and each of the plurality of memories comprising at least two sub memories arranged in sequence along a second direction; and
the first printed circuit board further comprises a plurality of memory interfaces arranged in sequence along the first direction, the capacitor structure being positioned between a side of a given one of the sub memories close to a given one of the plurality of memory interfaces and a side of the given memory interface away from an edge of the first printed circuit board.

14. The semiconductor device according to claim 13, wherein the first surface and the second surface are respectively provided with nine memories arranged in sequence along the first direction, each of the nine memories comprising two sub memories arranged in sequence along the second direction.

15. The semiconductor device according to claim 13, wherein the first printed circuit board further comprises a register respectively arranged on the first surface and the second surface; and the capacitor structure is positioned between a side of the register close to the given memory interface and the side of the given memory interface away from the edge of the first printed circuit board.

16. A semiconductor device, comprising:
a first printed circuit board comprising a plurality of memories arranged in sequence along a first direction, each of the plurality of memories having a first power terminal and a first ground terminal;
a capacitor structure positioned on the first printed circuit board, the capacitor structure comprising a plurality of capacitors, each of the plurality of capacitors having a second power terminal corresponding to the first power terminal and a second ground terminal corresponding to the first ground terminal; and a second printed circuit board, wherein the capacitor structure is positioned on the second printed circuit board, the capacitor structure comprises a plurality of first capacitors arranged in sequence along the first direction and a plurality of second capacitors arranged in sequence along a second direction;

wherein the first power terminal is electrically connected to the second power terminal, and the first ground terminal being electrically connected to the second ground terminal.

17. The semiconductor device according to claim 16, wherein the plurality of capacitors are fixed to a surface of the second printed circuit board by means of surface mounted technology.

18. The semiconductor device according to claim 16, wherein the second printed circuit board comprises a first board, a second board, and a capacitor material layer arranged between the first board and the second board; and
the plurality of capacitors are formed by pressing the capacitor material layer.

19. The semiconductor device according to claim 16, wherein the second printed circuit board comprises a first board and a second board, a capacitor container slot being respectively provided on a surface of the first board and a surface of the second board opposite to each other, and the capacitor structure being positioned in the capacitor container slot.

20. The semiconductor device according to claim 16, wherein the second printed circuit board is electrically connected to the first power terminal of a given one of the plurality of memories via the second power terminal, and the second printed circuit board being electrically connected to the first ground terminal of the given memory via the second ground terminal.

\* \* \* \* \*